United States Patent
Yoneda et al.

(10) Patent No.: US 8,202,463 B2
(45) Date of Patent: Jun. 19, 2012

(54) IMPRINT METHOD

(75) Inventors: Ikuo Yoneda, Yokohama (JP); Tetsuro Nakasugi, Yokohama (JP); Shinji Mikami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/426,527

(22) Filed: Apr. 20, 2009

(65) Prior Publication Data
US 2009/0267267 A1 Oct. 29, 2009

(30) Foreign Application Priority Data

Apr. 21, 2008 (JP) ................................. 2008-110641

(51) Int. Cl.
*B29C 59/00* (2006.01)
(52) U.S. Cl. .......... 264/293; 264/39; 264/101; 264/496; 425/174.4; 425/385
(58) Field of Classification Search ............ 264/293, 264/496, 39, 101; 425/385, 174.4
See application file for complete search history.

(56) References Cited

U.S. PATENT DOCUMENTS

| | | | | |
|---|---|---|---|---|
| 3,535,740 | A * | 10/1970 | Frowde .......................... | 425/89 |
| 6,875,553 | B2 * | 4/2005 | Daniel et al. ................ | 430/270.1 |
| 7,117,790 | B2 | 10/2006 | Kendale et al. | |
| 7,391,494 | B2 * | 6/2008 | Lee et al. ..................... | 349/190 |
| 7,704,425 | B2 * | 4/2010 | Heidari et al. ................ | 264/220 |
| 7,846,266 | B1 * | 12/2010 | Dibiase .......................... | 134/30 |
| 2002/0025408 | A1 * | 2/2002 | Davis ............................ | 428/141 |
| 2003/0041761 | A1 | 3/2003 | Rogers | |
| 2005/0156357 | A1 * | 7/2005 | Willson et al. ................ | 264/496 |
| 2005/0215713 | A1 * | 9/2005 | Hessell et al. ................ | 525/162 |
| 2005/0250303 | A1 * | 11/2005 | Hsieh et al. .................... | 438/612 |
| 2007/0059937 | A1 * | 3/2007 | Kang ............................. | 438/703 |
| 2007/0210468 | A1 * | 9/2007 | Tsuchida ........................ | 264/39 |
| 2007/0275114 | A1 * | 11/2007 | Cherala et al. ............. | 425/405.1 |
| 2008/0014533 | A1 * | 1/2008 | Keller et al. .................. | 430/311 |
| 2008/0145773 | A1 * | 6/2008 | Wang et al. .................... | 430/22 |
| 2009/0047606 | A1 * | 2/2009 | Schram et al. ................ | 430/322 |
| 2009/0057267 | A1 * | 3/2009 | Wuister et al. ................ | 216/52 |
| 2009/0105395 | A1 * | 4/2009 | Kamata et al. ................ | 524/502 |
| 2009/0243152 | A1 * | 10/2009 | Yuzawa et al. ................ | 264/293 |
| 2010/0078846 | A1 * | 4/2010 | Resnick et al. ............... | 264/101 |
| 2011/0033672 | A1 * | 2/2011 | Yang et al. .................. | 428/195.1 |

FOREIGN PATENT DOCUMENTS

JP 2000-194142 7/2000

OTHER PUBLICATIONS

Yoneda et al.. "Imprint System and Imprint Method", U.S. Appl. No. 12/237,435, filed Sep. 25, 2008.

* cited by examiner

*Primary Examiner* — Joseph Del Sole
*Assistant Examiner* — Nahida Sultana
(74) *Attorney, Agent, or Firm* — Finnegan, Henderson, Farabow, Garrett & Dunner, L.L.P.

(57) ABSTRACT

An imprint method includes contacting a template on a first substrate. The template includes a pattern to be transferred on the first substrate. The first substrate includes a first semiconductor substrate, and a first light curable resin coated on the first semiconductor substrate. The method further includes separating the template from the first substrate, and removing particles adhered on the template. The particle removal includes: pressing the template on an adhesive member which is distinct from the first substrate. The adhesive member includes a dummy substrate, a particle removing film formed on the dummy substrate and configured to remove the particles, and a second light curable resin coated on the particle removing film. The second light curable resin is thicker than the first light curable resin.

14 Claims, 13 Drawing Sheets

IMPRINT METHOD

CROSS-REFERENCE TO RELATED APPLICATIONS

This application is based upon and claims the benefit of priority from prior Japanese Patent Application No. 2008-110641, filed Apr. 21, 2008, the entire contents of which are incorporated herein by reference.

BACKGROUND OF THE INVENTION

1. Field of the Invention

The present invention relates to an imprint method used for manufacturing devices such as a semiconductor device, an optical device and a bio-product.

2. Description of the Related Art

In the process of manufacturing a semiconductor device, as a technology for satisfying both fabrication of fine patterns having 100 nm or less dimensions and mass production, imprint technology is now in attention.

Optical (UV) imprint is given as one of the imprint technology (Jpn. Pat. Appln. KOKAI Publication No. 2000-194142). The optical imprint includes a step of applying light curable resin on a substrate, a step of aligning a template with the substrate (alignment), a step of directly pressing the template down on the light curable resin (imprint), a step of hardening the light curable resin by light irradiation, and a step of separating the template from the light curable resin (demolding).

However, when the step of directly pressing the template down on the light curable resin is carried out in a state that particles are adhered on the template, pattern defects arise due to the remaining particles at the step of separating the template from the light curable resin.

BRIEF SUMMARY OF THE INVENTION

According to an aspect of the present invention, there is provided an imprint method comprising: An imprint method comprising: contacting a template on a substrate, the template including a pattern to be transferred on the substrate; separating the template from the substrate; and removing particle adhered on the template before contacting the template on the substrate, the removing the particle including pressing the template on an adhesive member and separating the pressed template from the adhesive member, wherein adhesiveness of the adhesive member to the template is higher than adhesiveness of the adhesive member to the substrate.

DETAILED DESCRIPTION OF THE INVENTION

Hereinafter, the embodiments of the present invention are described by referring to the drawings.

First, a problem of conventional imprint method found out by the inventors will be explained below.

Figure 18A:
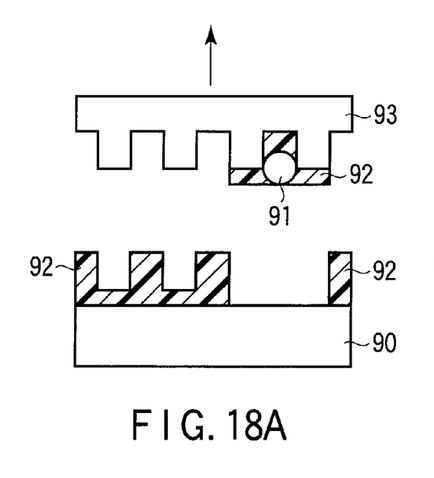
FIGS. 18A and 18B are cross-sectional views to explain a problem of imprint method found out by the present inventor.

As shown in FIG. 18A, a particle 91 may be adhesively left on a template 93 in a state that the particle 91 is firmed by light curable resin 92. On the other hand, relating to a substrate 90 on which a pattern is to be transferred, since a part of the light curable resin 92 that should be remained inherently on the substrate as a part of the pattern is lost, a defect (pattern defect) is generated.

Figure 18B:
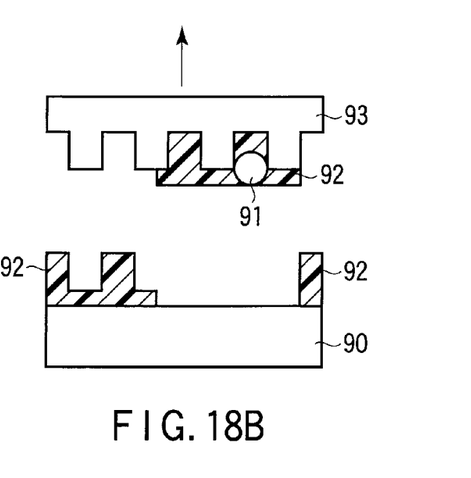

In addition, as shown in FIG. 18B, the defect may be larger when a fine pattern is formed by using the template 93 on which the defect 91 is remained.

As a solution for the foregoing particle problem, it is proposed to clean the template. As this kind of cleaning, the wet cleaning for removing the particle and organic material by solution is generally performed.

However, the wet cleaning requires relatively long time, in addition, the problem that reduction of equipment availability or throughput may be occurred depending on the frequency of cleaning. Furthermore, there is an undeniable possibility that new particles may be adhered on the template during the wet etching or during the storage of template after the cleaning.

Considering such circumstances, it is desired to provide a method of simply remove a particle adhered on the template in order to reduce the defect. However, the desired method has not been proposed yet.

In addition to the defect due to the above mentioned particle, a defect occurs because bubble is mixed into the light curable resin.

As a solution for this problem, there is a method that the imprint is performed in a vacuum. However, the method has a following problem. That is, it costs high as the apparatus for performing the imprint is large in size. In addition, the method has problems that imprint material (light curable resin) evaporates and transportation of the substrate takes time.

As an alternative solution, it is proposed to flow helium between the substrate and template such that the air which is a factor of the bubble with the helium. However, this method has a problem that high running cost is required since a large amount of helium is flowed but the flowed helium is not recovered even though the helium is an expensive gas.

Considering the foregoing circumstances, it has been longed a method which can simply prevents the bubble mixed in the light curable resin in order to reduce the defect, but the method has not been proposed yet.

Embodiments capable of solving the foregoing problem will be described below with reference to the accompanying drawings.

First Embodiment

FIGS. 1A to 1I are cross-sectional views to explain an imprint method according to a first embodiment.

When a repeat defect (common defect) is detected during an imprinting onto a substrate on which a pattern is to be transferred, the substrate is unloaded from an imprint apparatus, and a dummy substrate is loaded in the imprint apparatus.

Here, the repeat defect is formed in a manner that a pattern defect shown in FIG. 18A is generated repeatedly at least two times, or a pattern defect shown in FIG. 18B is generating after the generation of the pattern defect shown in FIG. 18A. The repeat defect (common defect) is detected by a known defect inspection method.

In addition, the substrate is, for example, a silica substrate (transparent substrate), a silicon substrate (semiconductor substrate) and an SOI substrate (semiconductor substrate). The substrate may have a multi-layer structure. For example, the substrate (having a multi-layer structure) may comprise the transparent substrate or the semiconductor substrate and an insulating film provided thereon. The insulating film is, for example, a silicon nitride film or a silicon oxide film to be a hard mask. The insulating film may have a multi-layer structure. In place of the insulating film, a semiconductor film or metallic film may be provided. Further, a multi-layer structure formed of at least two or more of the insulating film, the semiconductor film and the metallic film may be used.

Figure 1A:
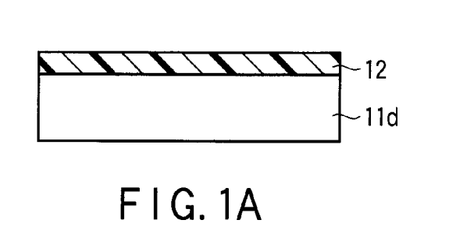
FIGS. 1A to 1I are cross-sectional views to explain an imprint method according to a first embodiment.

In addition, in the present embodiment, as shown in FIG. 1A, a dummy substrate including a Si wafer 11d and a particle removing film 12 formed on a surface of the wafer 11d is used.

The particle removing film 12 comprises material having high adhesiveness to organic material for imprinting, and the particle removing film 12 is a film having high adhesibility with respect to the template compared with the surface of the substrate used for a normal imprint recipe. Alternatively, the particle removing film 12 has high adhesibility to a light curable resin 13 compared with the surface of the substrate. Furthermore, the particle removing film 12 may have high adhesiveness to the template and the light curable resin 13. In the present embodiment, an under-layer anti-reflection film having a thickness of 900 nm is used as the particle removing film 12. The under-layer anti-reflection film is an anti-reflection film used for a normal optical exposure photomask. To give one example, an anti-reflection film called a bottom anti-reflective coating (BARC) film is used. The thickness of the particle removing film 12 is not limited to 900 nm, the particle removing film 12 may be any other thickness so long as adhesiveness between the particle removing film 12 and the Si wafer 11d is secured.

Figure 1B:
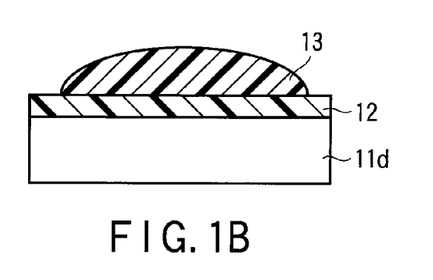

Next, as shown in FIG. 1B, the light curable resin 13 (imprint material) is coated on the dummy wafer (particle removing film 12.

In the present embodiment, the light curable resin 13 is coated so that the remaining film of the light curable resin 13 after being hardened (cured) has a thickness 160 nm. The thickness of the light curable resin 13 after being hardened is not limited to 160 nm. In this case, the light curable resin 13 may be any other thickness so long as adhesibility between the particle removing film 12 and the light curable resin 13 is secured. In general, the light curable resin 13 (second curable resin) is set thicker than a light curable resin (first curable resin) coated on a wafer in a normal imprint recipe. This is intended for removing the particles easily.

Figure 1C:
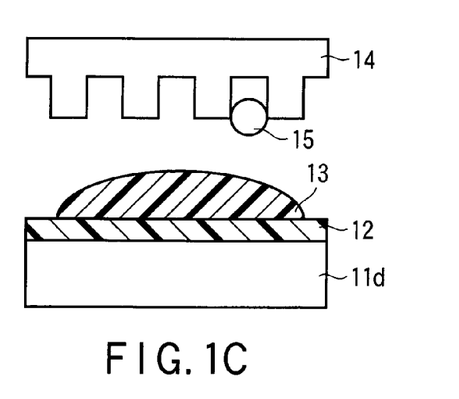

Next, as shown in FIG. 1C, the dummy wafer and an optical imprint template (hereinafter, referred to as template) 14 are aligned with each other (alignment). A particle 15 is adhered on the template 14.

Figure 1D:
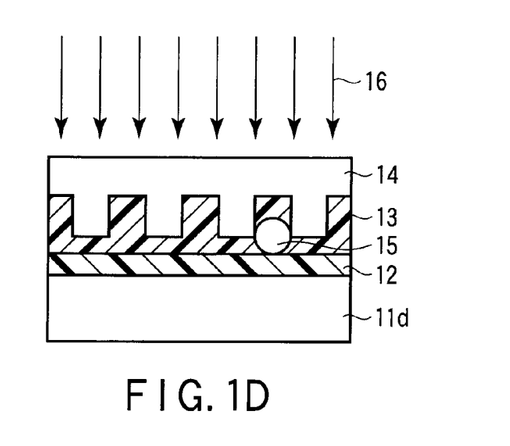

Next, as shown in FIG. 1D, the template 14 is directly contacted onto the light curable resin 13 (imprint), thereafter, the wafer 11d is irradiated with light (including UV to EUV) 16 so that the light curable resin 13 is hardened (cured).

At this time, contact & hold time of the template 14 to the light curable resin 13 and irradiation time of the light 16 are set different from a normal imprint recipe. In the present embodiment, the contact & hold time is set to 120 seconds, and the light irradiation time is set to 60 seconds. Namely, the contact & hold time and light irradiation time are set longer than the normal imprint recipe, and the mechanical strength of the light curable resin 13 after being hardened (cured) is made higher than usual, and thereby the particle is easy to be removed. In addition, the adhesion force between the light curable resin 13 and the template 14 is made weaker than the adhesion force between the light curable resin 13 and the particle removing film 12 and the adhesion force between the particle removing film 12 and the template 11.

Figure 1E:
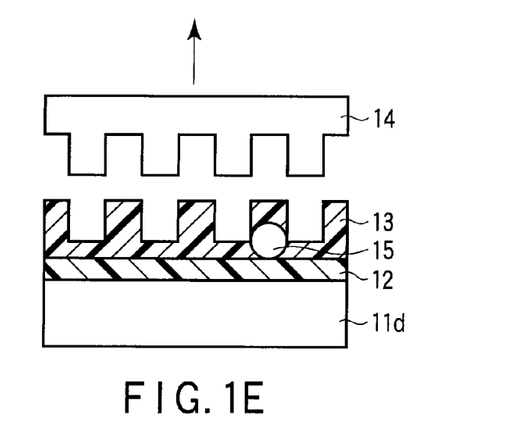

Next as shown in FIG. 1E, the template 14 is separated (released) from the hardened light curable resin 13 (demolding). At this time, since the light curable resin 13 is hardened so that the particle 15 is taken into the particle removing film 12 having the adhesion, the particle 15 is easily separated from the template 14. In addition, as the light curable resin 13 after being hardened has high mechanical strength, the light curable resin 13 after being hardened is suppressed to be a source of new particles. In this way, according to the present embodiment, it is possible to easily remove the particle 15 adhered on the template 14.

After the dummy shot, the dummy wafer is unloaded, and the substrate is loaded. Thereafter, as shown in FIGS. 1F to 1I, the imprinting for the substrate is restarted as usual. The Known steps of FIGS. 1F to 1I will be simply described.

Figure 1F:
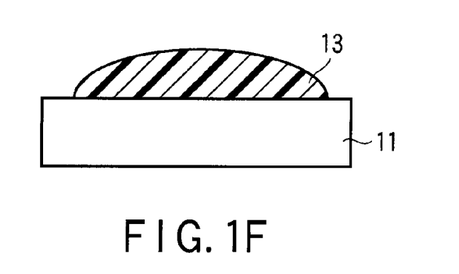

First, as shown in FIG. 1F, light curable resin 13 is coated on a substrate 11 on which a pattern is to be transferred.

Figure 1G:
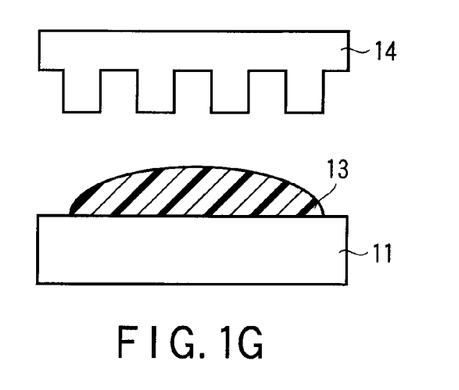

Next, as shown in FIG. 1G, the substrate 11 and the template 14 are aligned with each other (alignment).

Figure 1H:
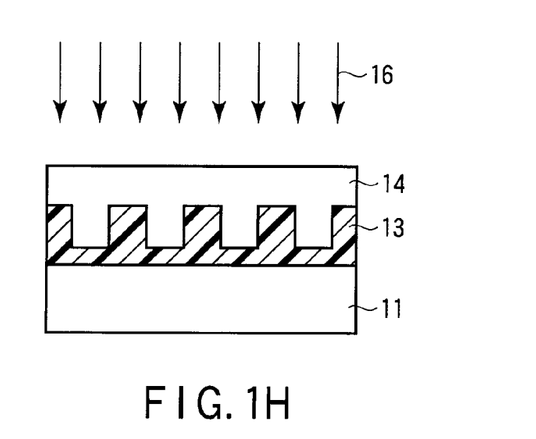

Next, as shown in FIG. 1H, the template 14 is directly contacted onto the light curable resin 13 (imprint). Thereafter the light curable resin 13 is harden by irradiating the light curable resin 13 with light (including UV to EUV) 15.

Figure 1I:
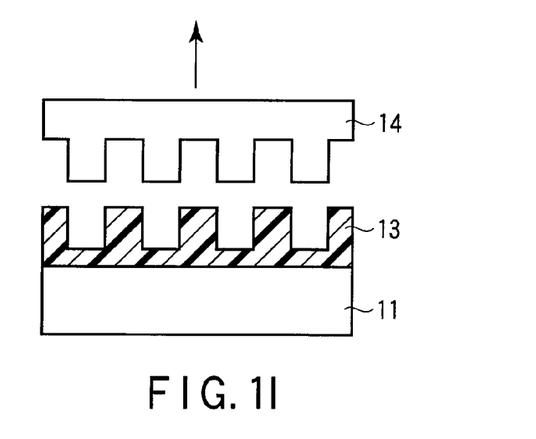

Next, as shown in FIG. 1I, the template 14 is separated from the light curable resin 13 (demolding).

Thereafter, the known steps, such as a step of forming a pattern on the substrate 11 by way of etching the substrate by using the light curable resin 13 as a mask and a step of removing the light curable resin 13 are followed.

The particle remove method of the present embodiment is applicable to a newly prepared template, which has not been used in an imprint process. Even if the template has not been used in the imprint process, there is a possibility that the adhesion of particle may occur during fabrication of template or storage of template. Therefore, even if the particle remove method of the present embodiment is employed in a first imprinting, the effect of preventing the generation of pattern defect is sufficiently obtained.

In addition, the particle remove method of the present embodiment is applicable to the case of first use of a temple which has undergone wet cleaning In the foregoing background, it has been described that wet cleaning has a possibility that a particle is newly adhered, but devices such as a memory have less limitation to the particle adhesion compared with logic devices. Therefore, the particle removal method of the present embodiment may be employed with respect to the devices such as a memory after wet cleaning.

In the present embodiment, particle remove is performed by using the dummy wafer which is a wafer different from the imprint wafer, but the particle remove may be performed by using a part region of the imprint wafer as the dummy wafer.

Second Embodiment

FIGS. 2A to 2D are cross-sectional views to explain an imprint method according to a second embodiment. In the following drawings, the same numerals are used to designate portions corresponding to the already given drawings, and the details are omitted.

Figure 2A:
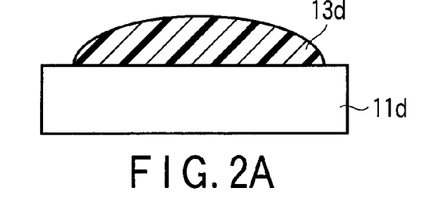
FIGS. 2A to 2D are cross-sectional views to explain an imprint method according to a second embodiment.

When a repeat defect is detected during imprinting onto a substrate on which a pattern is to be transferred, a dummy substrate is prepared which comprises an Si wafer $11d$ and a light curable resin $13d$ coated (shot) on the Si wafer $11d$ as shown in FIG. 2A.

The light curable resin $13d$ has high adhesiveness to a template compared with a surface of a substrate used for a normal imprint recipe. In the present embodiment, a light curable resin having higher shrinkage ratio and higher mechanical strength after the hardening than a light curable resin used for a normal imprint recipe (surface of the substrate) is used as the light curable resin $13d$.

Figure 2B:
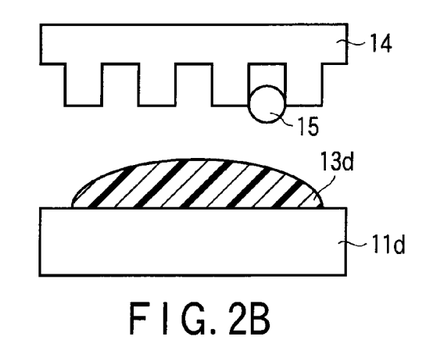

Next, as shown in FIG. 2B, the substrate $11d$ and the template 14 are aligned with each other (alignment).

Figure 2C:
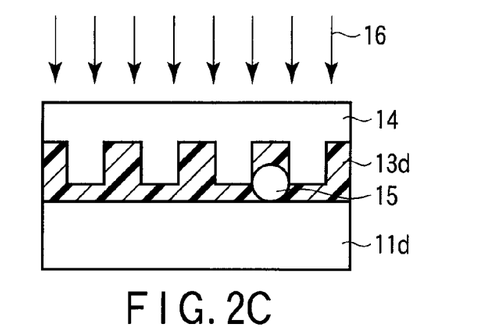

Next, as shown in FIG. 2C, the template 14 is directly contacted onto the light curable resin $13d$ (imprint), thereafter the light curable resin $13d$ is harden by irradiating the light curable resin $13d$ with the light (including UV to EUV). At this time, the adhesion force between the light curable resin $13d$ and the template 14 is weaker than the adhesion force between the particle 15 and the substrate $11d$.

Figure 2D:
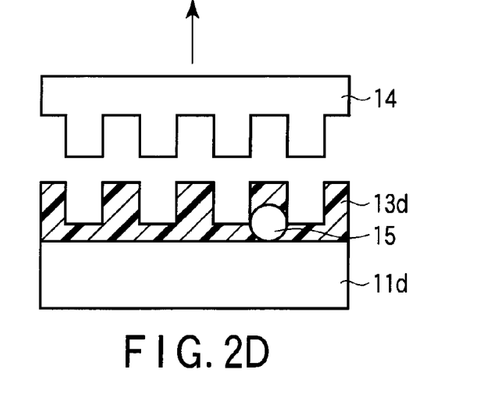

Next, as shown in FIG. 2D, the template 14 is separated from the hardened (cured) light curable resin $13d$ (demolding). At this time, since the material (removing material) of the light curable resin $13d$ is an organic material having high shrinkage and high mechanical strength after the hardening, the particle 15 is separated from the template without generating a new particle. That is, after the demolding, the particle 15 is taken into the light curable resin $13d$. In this way, according to the present embodiment, the particle 15 adhered on the template 14 is simply removed.

Thereafter, the known processes from FIGS. 1F to 1I are carried out like the first embodiment.

In addition, the particle remove method of the present embodiment is applicable to a newly prepared template and a template after cleaned like the first embodiment, furthermore, a part of region of the imprinted wafer may be used as the dummy wafer.

Third Embodiment

Figure 3:
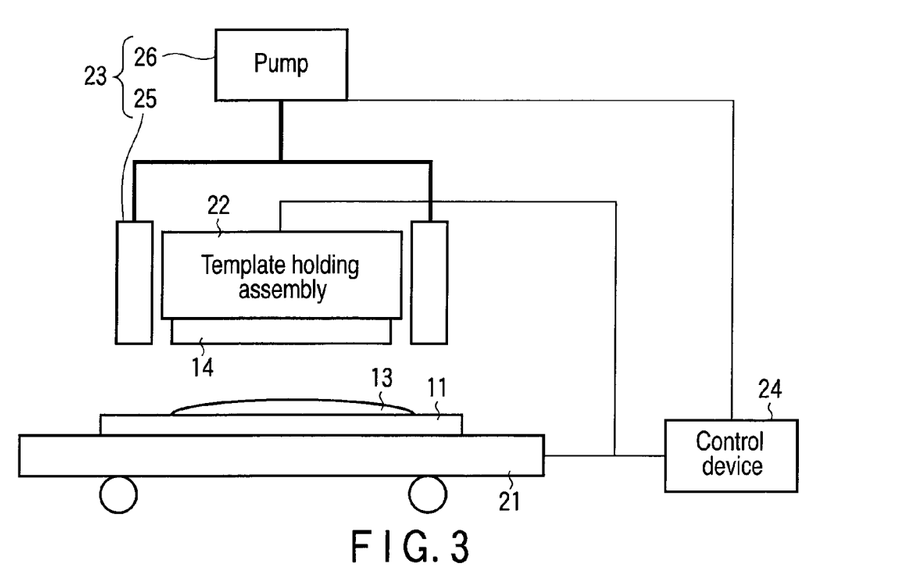
FIG. 3 is a view schematically showing an imprint apparatus according to a third embodiment.

FIG. 3 is a view schematically showing an imprint apparatus according to a third embodiment.

The imprint apparatus of the present embodiment comprises a stage 21 on which the substrate 11 is to be placed, a template holding assembly 22 provided above the stage 21 and configured to hold the template 14 including a pattern formed of concave and convex (transfer pattern), a vacuum device 23 configured to maintain a vacuum state between the template 14 and the substrate 11, and control device 24 configured to control each units 21, 22, and 23.

Figure 4:
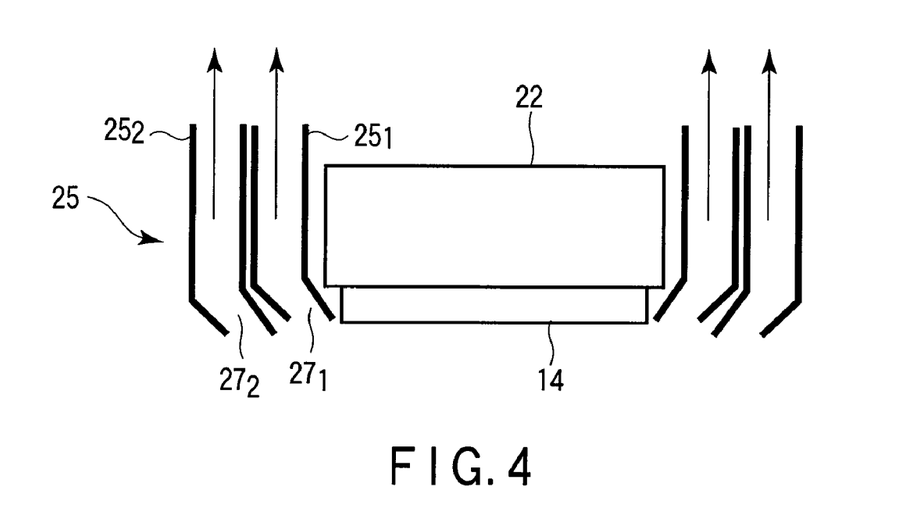
FIG. 4 is a view schematically showing an exhaust pipe of the imprint apparatus shown in FIG. 3.

The vacuum device 23 comprises an exhaust pipe 25 and a vacuum pump 26 connected to the exhaust pipe 25. As shown in FIG. 4, the exhaust pipe 25 includes a first exhaust pipe $25_1$ and a second exhaust pipe $25_2$. A suction port $27_1$ of the first exhaust pipe $25_1$ is positioned on a side of the template 14, a suction port $27_2$ of the second exhaust pipe $25_2$ is positioned on an outside of template 14. The first exhaust pipe $25_1$ is configured to make a high vacuum area on the side of the template 14, the second exhaust pipe $25_2$ is configured to make a low vacuum area on the outside of template 14. That is, the vacuum device 23 is configured to selectively make vacuum the area between the template 14 and the substrate 11 by differential pumping method.

The template holding assembly 22 is provided with a correction mechanism required for aligning the template 14 with the substrate 11 and a press unit to press the template 14 onto the substrate 11. In addition, the template holding assembly 22 is provided with an opening (not shown), and by way of the opening, light (e.g., UV light) emitted from a light source (not shown) transmits through the template 14, and the light curable resin 13 is irradiated with the transmitted light. That is, the template holding assembly 22 is known, and there is no need to be a special assembly.

When an imprint process is carried out using the imprint apparatus of the present embodiment, a vacuum state is generated in the area between the template 14 and the substrate 11, which serves to prevent bubble from being mixed into the light curable resin 13 on the substrate, and hence the generation of pattern defect resulting from the bubble is suppressed.

In addition, the present embodiment, since the vacuum state is selectively generated in the area between the template 14 and the substrate (vacuum process), the problem of conventional technology in which the whole of imprint apparatus is made under vacuum state is solved.

Figure 5:
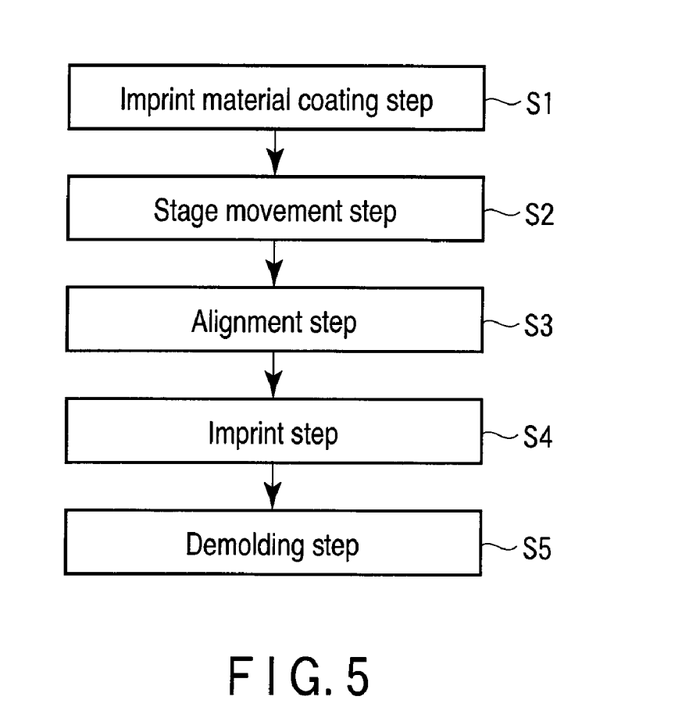
FIG. 5 is a flowchart to explain a flow of imprint process.
Figure 6:
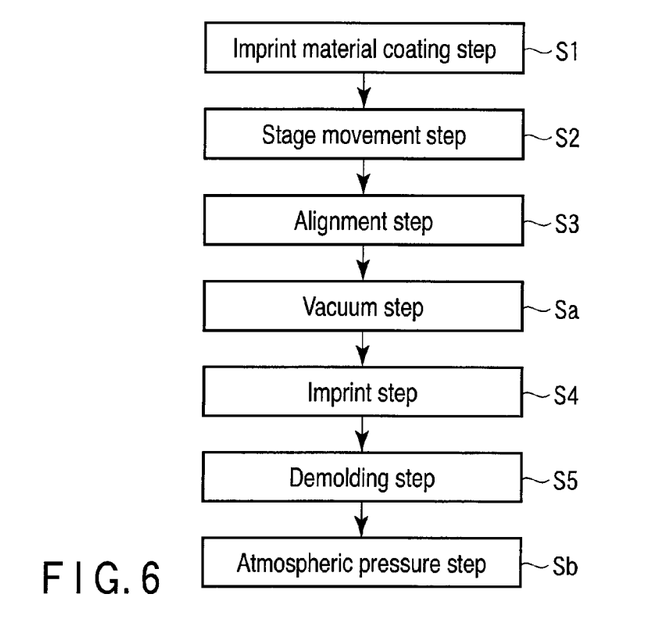
FIG. 6 is a flowchart to explain an imprint process according to a third embodiment.
Figure 7:
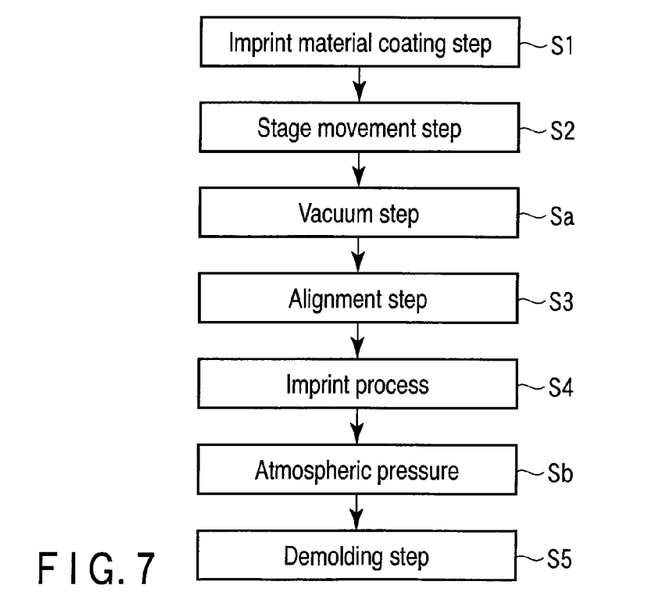
FIG. 7 is a flowchart to explain another imprint process according to a third embodiment.
Figure 8:
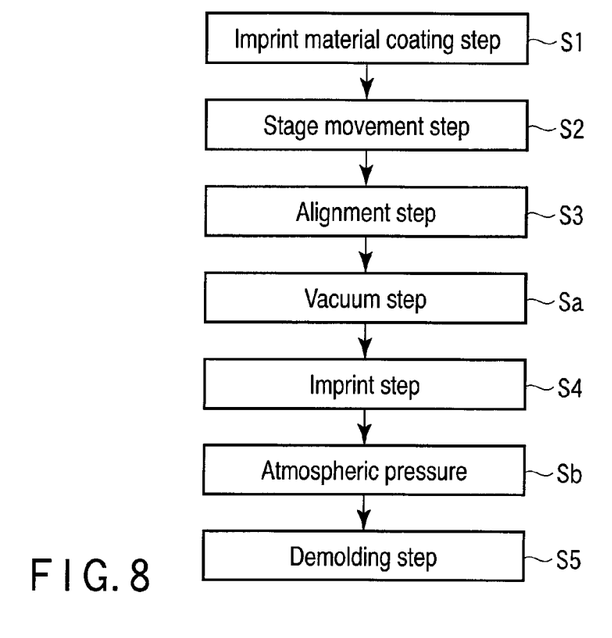
FIG. 8 is a flowchart to explain another imprint process according to a third embodiment.
Figure 9:
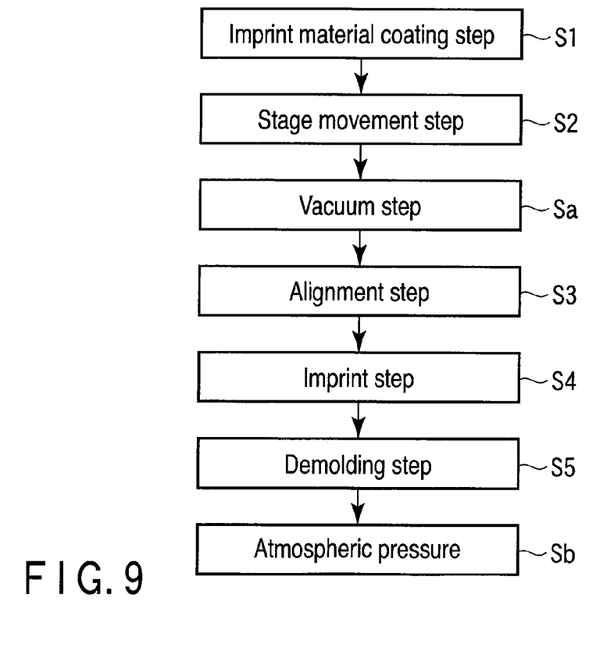
FIG. 9 is a flowchart to explain another imprint process according to a third embodiment.

As described above, in generally, the imprint process includes the imprint material coating step, the aligning step (alignment), the imprint step (pressing) and the demolding step (separating), but more specifically, as shown in FIG. 5, the imprint process further includes a step (stage movement step) S2 of moving the stage 21 with the substrate 11 being placed thereon directly under the template 12. The stage movement step S2 is carried out between the imprint material coating step S1 and the alignment step S3.

Figure 10A:
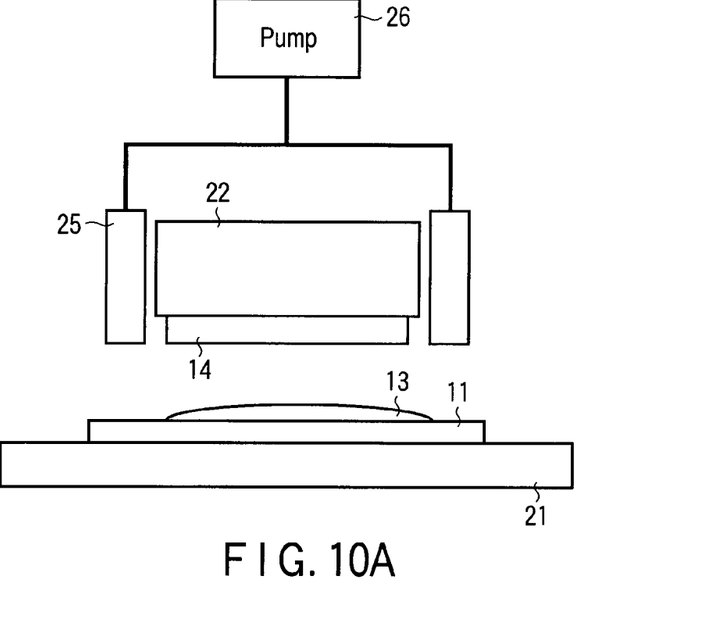
FIGS. 10A and 10B are views schematically showing a state of imprint apparatus at the time of completion of imprint material coating step in the flow of FIG. 6 and a state of the imprint apparatus at the time of vacuum step in the flow of FIG. 6.
Figure 10B:
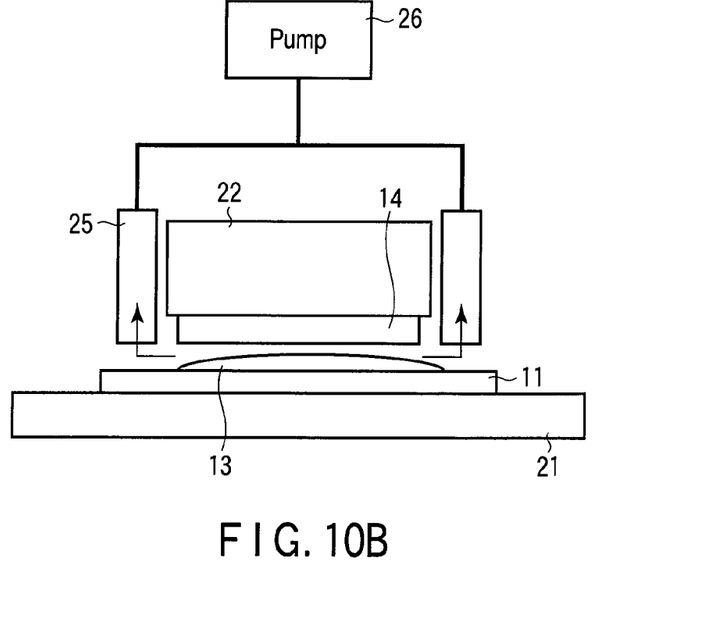

FIGS. 6 to 9 show the flow of the imprint process of the present embodiment. The present embodiment includes a vacuum step Sa. Therefore, the present embodiment further includes a step (atmospheric pressure step) Sb of bringing back the pressure of atmosphere (vacuum atmosphere) in which the substrate 11 is exposed to the atmospheric pressure. This atmospheric pressure step Sb is carried out after the demolding step S5 or between the imprint step S4 and the demolding step S5. With respect to the case of flow of FIG. 6, the state of the imprint apparatus at the time of completion of the imprint material coating step S1 is schematically shown in FIG. 10A, and the state of the imprint apparatus at the time of the vacuum step Sa is schematically shown in FIG. 10B. The control device 24 controls the each units 21, 22 and 23 so that the steps are carried out according to the order shown in the flows of FIGS. 6 to 9.

Fourth Embodiment

Figure 11A:
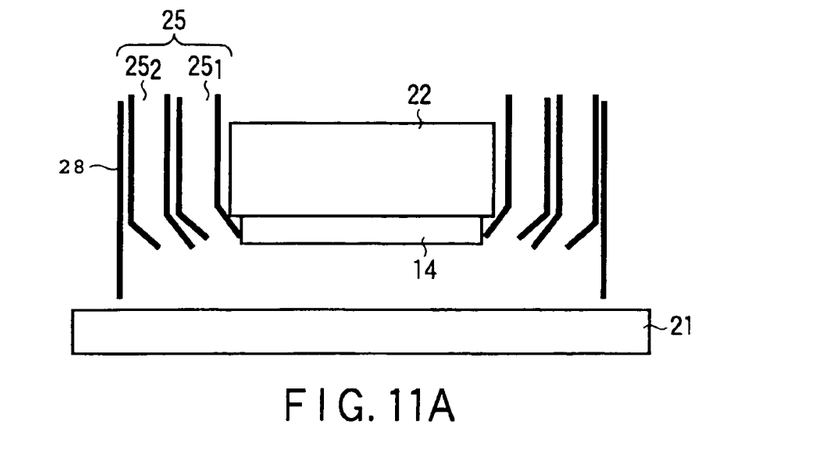
FIGS. 11A and 11B are views schematically showing an imprint apparatus according to a fourth embodiment.
Figure 11B:
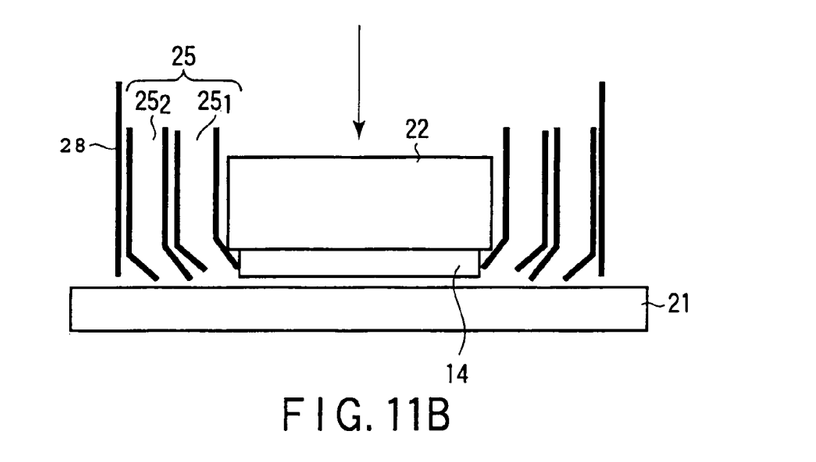

FIGS. 11A and 11B are schematic views showing an imprint apparatus according to a fourth embodiment.

The present embodiment differs from the third embodiment in that the imprint apparatus further comprises a shield plate 28 which is provided outside the exhaust pipes 25 ($25_1$, $25_2$).

According to the configuration, when the template 14 is surrounded by the shield plate 28 without contacting, the vacuum suction between the template 14 and the substrate 11 can be performed even if during the movement of template 14 (or stage unit 21) as shown in FIG. 11B. Thereby, the generation of the pattern defect due to the bubble is suppressed more effectively.

Fifth Embodiment

Figure 12:
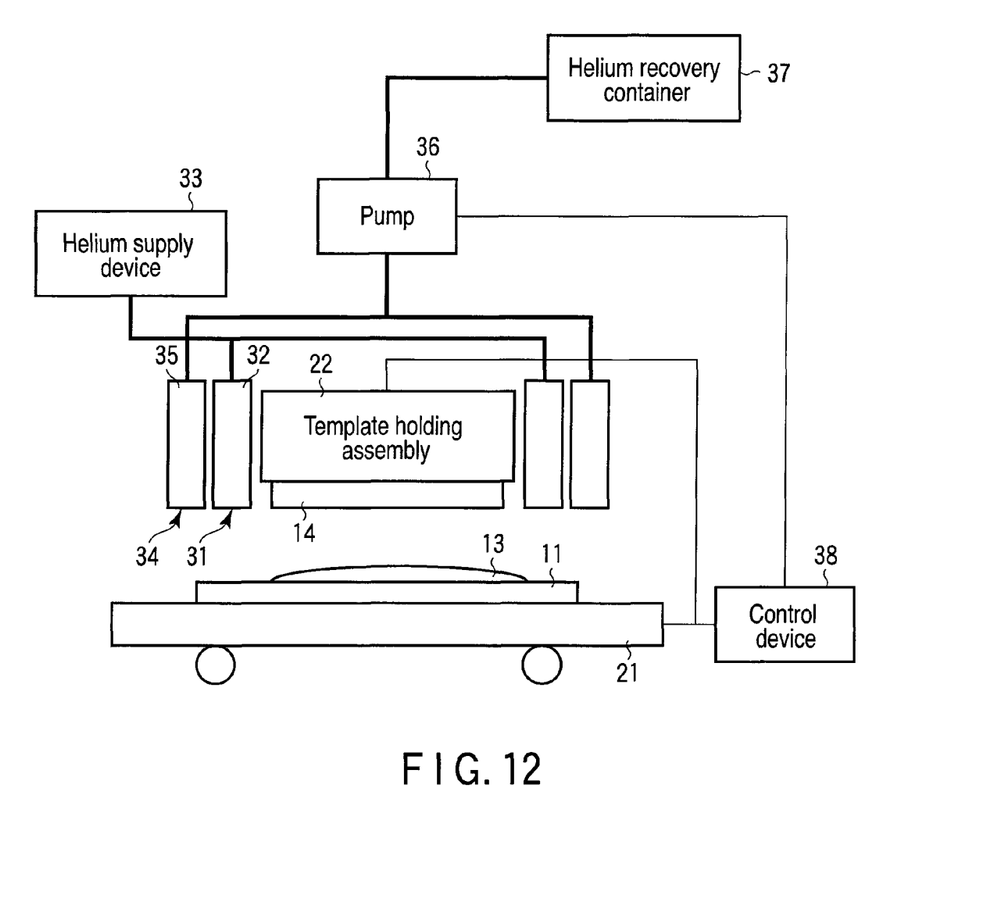
FIG. 12 is a view schematically showing an imprint apparatus according to a fifth embodiment.

FIG. 12 is a schematic view showing an imprint apparatus according to a fifth embodiment.

The imprint apparatus of the present embodiment comprises the stage 21 on which the substrate 11 is to be placed, the template holding assembly 22 provided above the stage 21 and configured to hold the template 14 including a pattern formed of concave and convex (transfer pattern), a helium supply pipe 32 including a supply port 31 located on the side of the template 14, a helium supply device 33 configured to supply helium gas having high purity to the helium supply pipe 32, a helium suction pipe 35 including a suction port 34 located outside of the supply port 31, a suction pump 36 connected to the helium suction pipe 35, a helium recovery container 37 configured to store the helium which is sucked by the suction pump 36 and recovered, control device 38 configured to control the units 21, 22, 36.

The helium supply pipe 32 and the helium supply device 33 constitute an air/helium exchange device for exchanging air in an area between the substrate 11 and the template 14 for helium. The area between the substrate 11 and the template 14 can be isolated from the air by the air/helium and the area can be evacuated by the air/helium exchange device.

Figure 13:
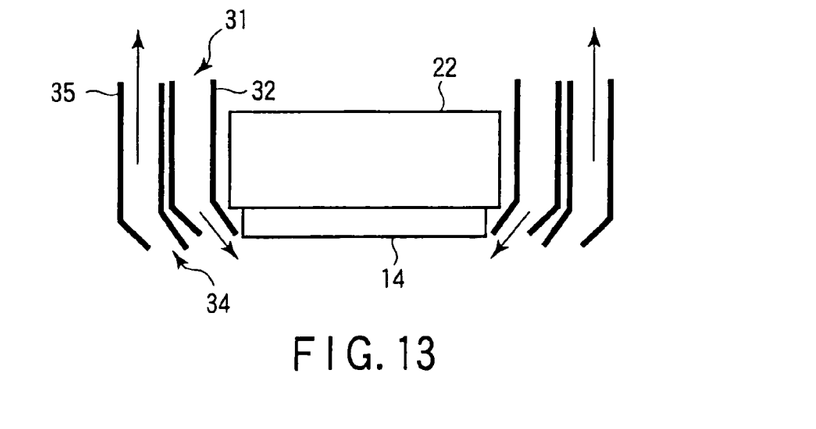
FIG. 13 is a view showing configuration of helium supply pipe and a helium suction pipe of the imprint apparatus shown in FIG. 12.

The helium suction pipe 35, suction pump 36 and helium recovery container 37 constitute a helium recovery device for recovering helium flowing out the atmosphere. FIG. 13 shows the more concrete configuration of the helium supply pipe 32 and the helium suction pipe 35. The supply port 31 of the helium supply pipe 32 faces toward the side of the template 14. Similarly, suction port 34 of the helium suction pipe 35 faces toward the side of the template 14. The direction, shape, size and position of the suction port 34 of the helium suction pipe 35 are properly designed so that the helium gas flowing out the atmosphere is effectively recovered.

According to the present embodiment, the air/helium exchange device supplies the helium gas in the area between the substrate 11 and the template 14 such that the air to be the cause of bubble is exchanged for the air (air/helium exchange step), thereby the generation of the pattern defect is suppressed, while the helium recovery device recoveries the supplied helium gas, which enables the expensive helium gas to reuse, thereby the increasing of running cost is suppressed.

Figure 14A:
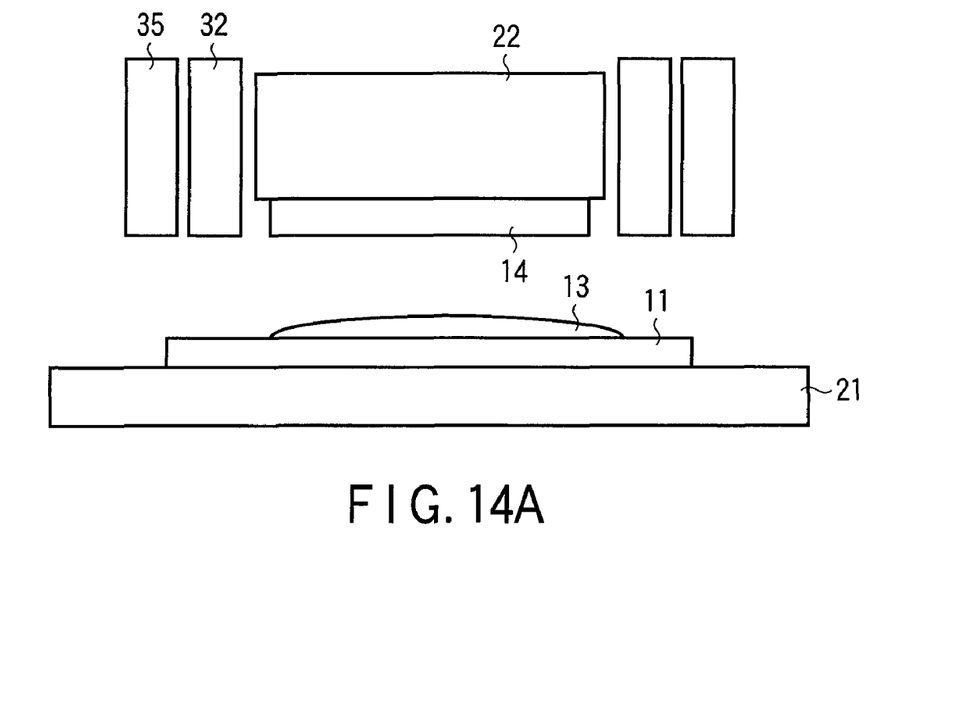
FIGS. 14A and 14B are views schematically showing a state of an imprint apparatus when an imprint material coating process is completed in the flow of FIG. 6 and a state of the imprint apparatus in an air/helium exchange process, respectively.
Figure 14B:
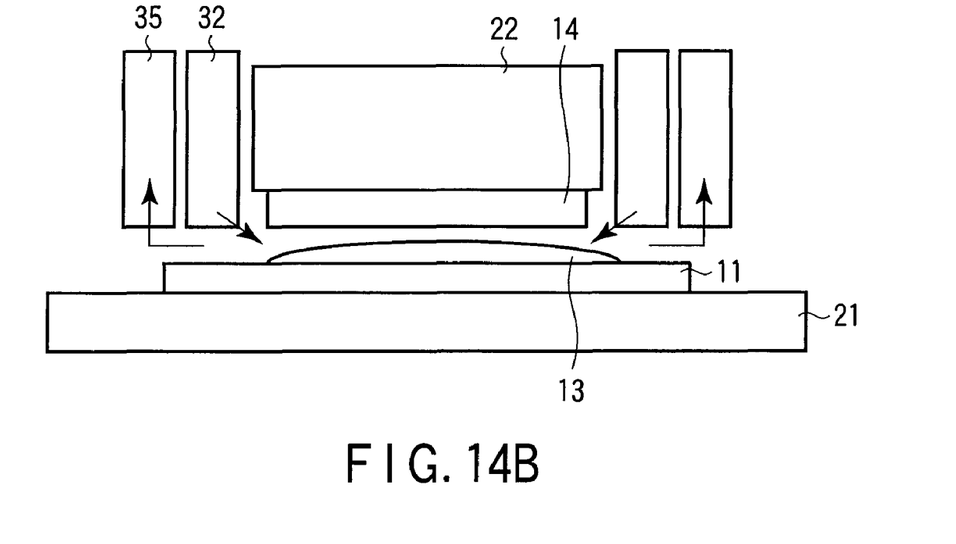

An example of flow of imprint process including the air/helium exchange step of the present embodiment is obtained by replacing the vacuum steps of the flows shown in FIGS. 6-9 with the air/helium exchange steps. With respect to the case of flow of FIG. 6, the state of the imprint apparatus at the time of completion of the imprint material coating step S1 is schematically shown in FIG. 14A, and the state of the imprint apparatus at the time of the air/helium exchange step Sc is schematically shown in FIG. 14B. The control device 24 controls the each units 21, 33 and 36 so that the steps are carried out according to the order shown in the flows of FIGS. 6 to 9.

In addition, the template 14 may be surrounded by the shield plate 28 without contacting like the fourth embodiment. In this way, the helium gas flowing out the atmosphere is recovered more effectively. Furthermore, an inert gas other than the helium gas may be used.

Sixth Embodiment

The conventional imprint method has the following problem. That is, as shown in FIG. 15A, when the surface of substrate 11 (Si substrate 11a+underlying layer 11b) has an unevenness having level difference (i.e., is not flat), the template 14 is inclined and obliquely pressed onto the substrate 11 in the imprint step (press) as shown in FIG. 15B, and the thickness of the remaining film thickness varies on the substrate 11.

Figure 15A:
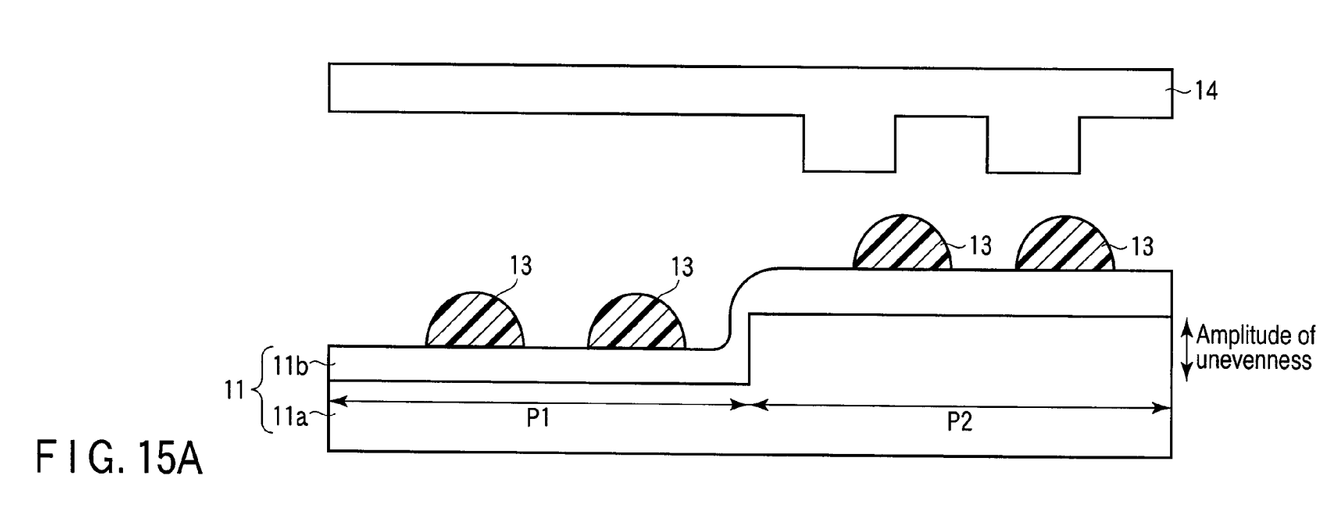
FIGS. 15A and 15B are cross-sectional views to explain a problem of conventional imprint method.
Figure 15B:
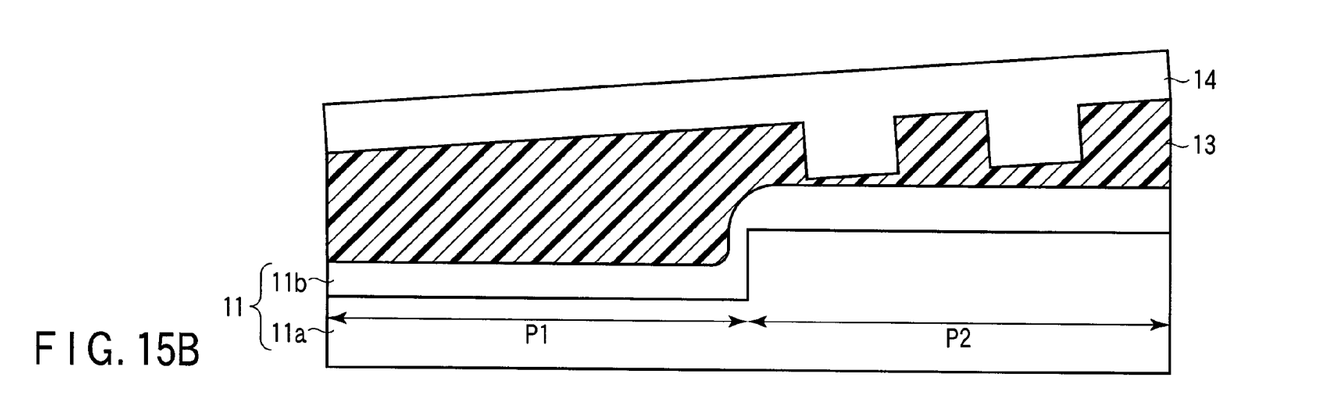

The reasons for the inclining of template 14 as shown in FIG. 15A are as follows. First, an amount of a light curable resin 13 (amount of imprint material coating) coated on surfaces P1 and P2 of the unevenness is constant regardless of place, secondary, an area of the template positioned above the lower level surface P1 of the unevenness on the substrate 11 does not have a pattern (being flat), thirdly, the template 14 on the lower level surface P1 is distorted so that it may sink downward since the template 14 is pressed onto the surfaces P1 and P2 of the unevenness.

Removal of the remaining film is performed by anisotropic etching. However, if the thickness of the remaining film is not uniform, the thick remaining film is not removed fully and remains, on the contrary, the thin remaining film is removed, and moreover the underlying layer 11b under the thin remaining film is also etched. As a result, dimensional variation occurs with respect to the pattern transferred to the underlying layer 11b, and a problem of reduction of device yield arises.

Figure 16A:
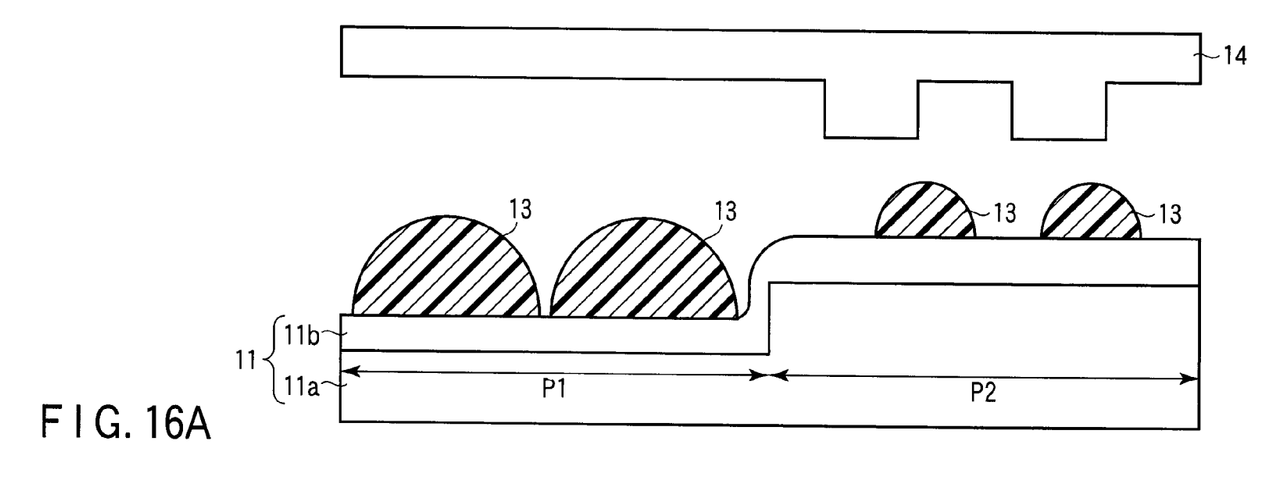
FIGS. 16A and 16B are cross-sectional views to explain an imprint method according to a sixth embodiment.
Figure 16B:
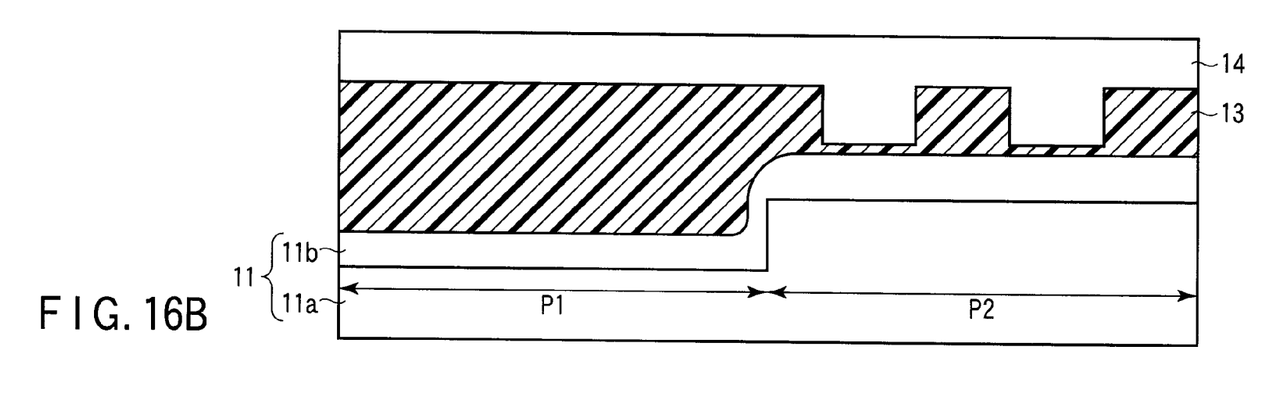

Then, an imprint method of the sixth embodiment capable of solving the foregoing problem will be described below. FIGS. 16A and 16B are cross-sectional views to explain the imprint method of the present embodiment.

First, as shown in FIG. 16A, a light curable resin (imprint material) 13 is coated on a surface of the substrate (Si substrate 11a+underlying layer 11b) on which a pattern is to be transferred. The light curable resin 13 is coated by using an inkjet type coating method.

Here, in a case of the present embodiment, the coating amount distribution of the light curable resin 13 on the surfaces P1 and P2 of the unevenness is not uniform, unlike with the conventional case. That is, the coating amount of the light curable resin 13 on the lower level surface P1 is larger than the coating amount of the light curable resin 13 on the higher level surface P2. This point will be described more detail later.

Next, as shown in FIG. 16B, the substrate 11 and the template 14 are aligned with each other (alignment), the template 14 is directly contacted onto the light curable resin 13 (imprint), thereafter the light curable resin 13 is hardened by irradiating the light curable resin 13 with light.

At this time, since the coating amount of the light curable resin 13 on the lower level surface P1 is larger than that of the higher level surface P2, the distortion that the template 14 on the lower level surface P1 sink downward is sufficiently decreased. Thereby, the remaining film 13b is suppressed to have uneven thickness, so that the foregoing problem of the conventional imprint method of FIGS. 15A and 15B is solved.

After the step of FIG. 16B, the known steps such as separating the light curable resin 13 from the template 14 (demolding) or the like are performed.

Figure 17:
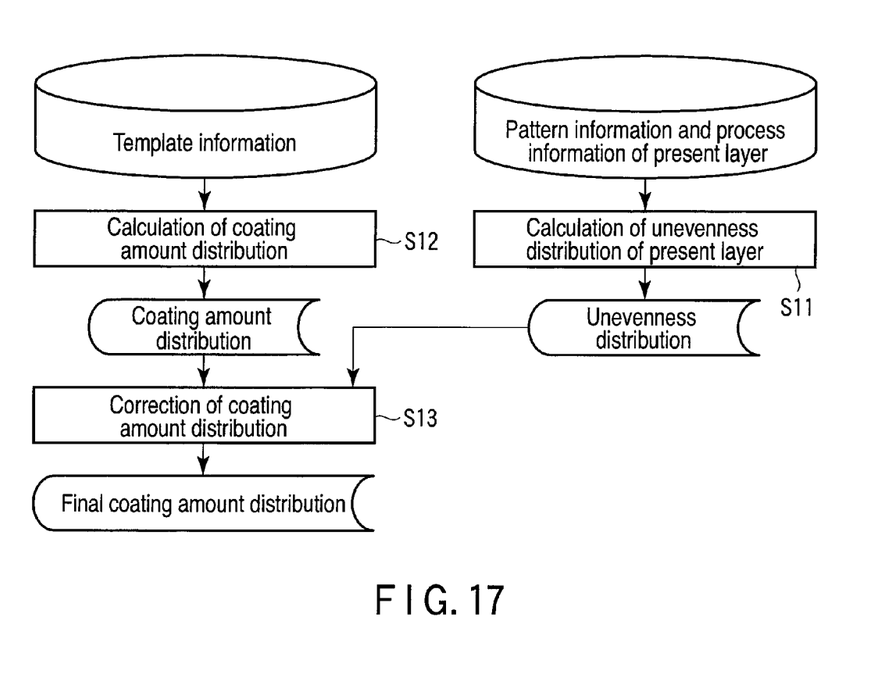
FIG. 17 is a flowchart to explain how to determine a coating distribution of light curable resin material in the imprint method according to the sixth embodiment.

Next, a method of determining the coating amount distribution of light curable resin 13 will be described below using a flowchart of FIG. 17. In case of the unevenness shown in FIGS. 16A and 16B, basically, the amount of light curable resin 13 to be coated on the lower level surface P1 is increased more than the conventional case so that the template 14 is not inclined to the substrate 11 at the time of directly contacting template 14 onto the substrate 11 (at the time of imprint). In general, the following procedures are taken.

First, a calculation for obtaining level difference and location of unevenness (unevenness distribution) on the surface of substrate 11 (present layer) where the light curable resin 13 is newly coated is performed (step S11).

The foregoing unevenness distribution is calculated based on information related to a pattern of layer (pattern information) formed in a step which is earlier than the step of the present layer by one step (previous step layer) and information related to a process (process information) used for forming the pattern.

The pattern information includes design pattern information such as shape of a pattern to be formed on a present layer, dimensions of the pattern (longitudinal dimension, transverse dimension, height dimension) and arrangement position of the pattern.

The process information includes information relating to a processing method such as film forming method and etching method used for forming a pattern to be on a present layer, and information relating to material of the pattern to be formed on the present layer.

Even if the case of forming the same pattern, for example, when the pattern is an insulating pattern filling a trench, the amplitude of unevenness arises on the surface may be different depending on the difference of forming method of insulating film, for example, the amplitude of unevenness may be different between spin coating method and CVD method. In addition, even if the case of the same forming method of insulating film, the amplitude of unevenness arises on the surface may be different depending on the difference of material of insulating film since characteristic such as viscosity changes in the different material of the insulating film.

In this manner, the present embodiment estimated the amplitude of unevenness that may actually be formed and its distribution on a basis of the information related to the design pattern and the information related to the process to be used actually.

On the other hand, the coating amount distribution of light curable resin 13 to be coated on the substrate 11 is calculated on a basis of information related to the template 14 (template information) as in the conventional manner (step S12). The template information includes information such as shape of a pattern formed on the template 14, dimensions of the pattern (longitudinal dimension, transverse dimension, height dimension), arrangement position of the pattern, and thickness of remaining film when the template 14 is used.

Next, the coating amount distribution calculated in step S12 is corrected based on the unevenness distribution calculated in step S11, and a coating amount distribution (final coating amount distribution) of the light curable resin 13 to be actually coated on the substrate 11 is determined (step S13).

Concretely, a portion having unevenness is extracted from the unevenness distribution calculated in step S11, and if a portion of the template corresponding to the extracted portion does not have a pattern, the coating amount of the light curable resin 13 to be coated on the lower level surface of the unevenness is set larger. At this time, the increment of the coating amount is determined in accordance with an amplitude of the unevenness which is extracted from the unevenness distribution calculated in step S11. The increment is determined based on a previously prepared table or calculating formula.

The method of the present embodiment is carried out as a system. For example, the system which performs the method of the present embodiment is constructed by replacing the steps S11-S13 of FIG. 17 with units including hardware which performs the steps S11-S13, and by replacing the data (the unevenness distribution, the coating amount distribution, the final coating amount distribution) of FIG. 17 with storage device for storing the data.

The above storage device may comprises a first storage device configured to storage the unevenness distribution, a second storage device configured to storage the coating amount distribution and a third storage device configured to storage the final coating amount distribution. In addition, the above storage device may comprises a first storage device configured to storage the unevenness distribution, a second storage device configured to storage the coating amount distribution and the final coating amount distribution. Further, the above storage device may store the unevenness distribution, the coating amount distribution, and the final coating amount distribution in one storage device.

Various embodiments of the present invention have been described. However, the present invention is not limited to the foregoing embodiments. For example, though the above embodiments recite the case of light (UV) imprint, the present invention is applicable to other types of imprint method such as thermal imprint method and room-temperature imprint method.

In addition, the imprint method of the present embodiment is applicable to various device manufacturing methods such as manufacturing method for semiconductor device (e.g., MOS transistor constituting CMOS logic), manufacturing method for micro lens array (optical device). Further, the imprint method of the present embodiment is applicable to form a pattern constituting DNA chip (bio-product) to be formed on a Si wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imprint method comprising:
    contacting a template on a first substrate, the template including a pattern to be transferred on the first substrate, the first substrate comprising a first semiconductor substrate, and a first light curable resin coated on the first semiconductor substrate;
    separating the template from the first substrate; and removing particles adhered on the template, the particle removal including:
  pressing the template on an adhesive member which is distinct from the first substrate, the adhesive member comprising a dummy substrate, a particle removing film formed on the dummy substrate and configured to remove the particles, and a second light curable resin coated on the particle removing film, wherein the second light curable resin is thicker than the first light curable resin;
  irradiating the adhesive member with light so that the second light curable resin is hardened; and
  separating the pressed template from the adhesive member in which the second light curable resin is hardened,
  wherein the particle removal is performed when a repeat defect is detected during an imprinting onto the substrate.

2. The imprint method according to claim 1,
wherein the particle removing film is an anti-reflection film.

3. The imprint method according to claim 2,
wherein the anti-reflection film is a bottom anti-reflective coating film.

4. An imprint method comprising:
contacting a template on a first substrate, the template including a pattern to be transferred on the first substrate, the first substrate comprising a first semiconductor substrate, and a first light curable resin coated on the first semiconductor substrate;
separating the template from the first substrate; and
removing particles adhered on the template, the particle removal including:
  pressing the template on an adhesive member which is distinct from the first substrate, the adhesive member comprising a dummy substrate, a particle removing film formed on the dummy substrate and configured to remove the particles, and a second light curable resin coated on the particle removing film;
  irradiating the adhesive member with light so that the second light curable resin is hardened; and
  separating the pressed template from the adhesive member in which the second light curable resin is hardened,
  wherein the particle removal is performed when a repeat defect is detected during an imprinting onto the substrate; and
  wherein the first and second light curable resins are cured in a condition that the cured second light curable resin has higher mechanical strength than the cured first light curable resin.

5. The imprint method according to claim 4,
wherein the condition includes contact and holding time between the second light curable resin and the template, and the contact and holding time is set longer than the contact and holding time for a light curable resin and a template in a normal imprint recipe.

6. The imprint method according to claim 5,
wherein the condition further includes light irradiating time for the first and second light curable resins, and the light irradiating time for the second light curable resin is set longer than the light irradiating time for the first curable resin.

7. The imprint method according to claim 1, wherein
the second light curable resin has higher shrinkage ratio than the first light curable resin when the first and second light curable resins are cured.

8. The imprint method according to claim 1,
wherein the transferring the pattern of the template on the first substrate is performed under a condition that an area between the template and the first substrate is isolated from air.

9. The imprint method according to claim 8,
wherein the area between the template and the first substrate is isolated from the air by selectively exhausting the air before transferring the pattern of the template on the first substrate.

10. The imprint method according to claim 8,
wherein the exhausting the air is performed by differential pumping method.

11. The imprint method according to claim 8,
wherein the area between the template and the first substrate is isolated from the air by exchanging the air for inert gas before transferring the pattern of the template on the first substrate.

12. The imprint method according to claim 11,
wherein the inert gas is helium gas.

13. The imprint method according to claim 9, wherein the exhausting the air is performed by using a vacuum device which comprises an exhaust pipe and a vacuum pipe connected to the exhaust pipe, and the exhaust pipe comprises a first exhaust pipe configured to make a high vacuum area on a side of the template, and a second exhaust pipe configured to make a low vacuum area on an outside of template.

14. The imprint method according to claim 13,
wherein a suction port of the first exhaust pipe is positioned on the side of the template, and a suction port of the second exhaust pipe is positioned on the outside of the template.

* * * * *